Figure 1:
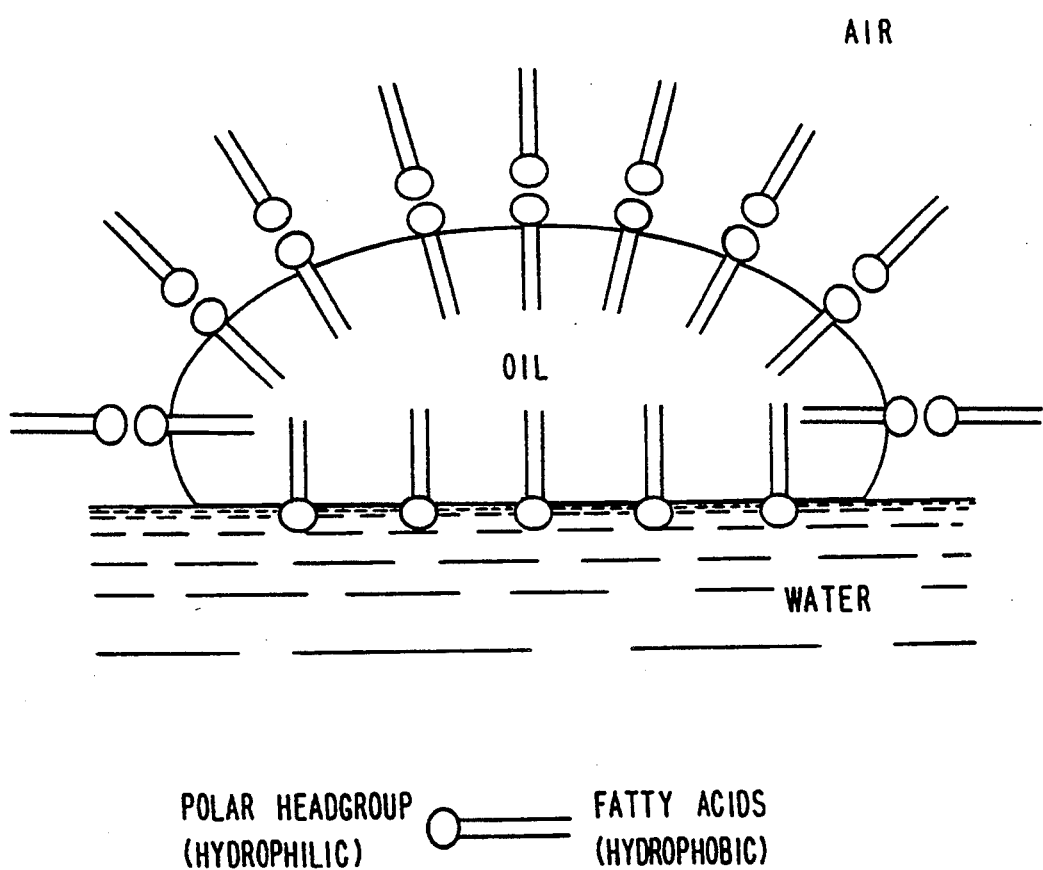

United States Patent [19]
Gatt et al.

[11] Patent Number: 5,376,183
[45] Date of Patent: Dec. 27, 1994

[54] METHOD FOR CLEANING INDUSTRIAL AND DOMESTIC ARTICLES AND SURFACES CONTAMINATED WITH ORGANIC OR LIPOPHILIC WASTES

[75] Inventors: Shimon Gatt; Yechezkel Barenholz; Herve Bercovier, all of Jerusalem, Israel

[73] Assignee: Yissum Research Development Company of the Hebrew University of Jerusalem, Jerusalem, Israel

[21] Appl. No.: 13,846

[22] Filed: Feb. 5, 1993

Related U.S. Application Data

[63] Continuation-in-part of Ser. No. 653,319, Feb. 11, 1991.

[51] Int. Cl.⁵ .................................................. A61K 7/50
[52] U.S. Cl. ........................................ 134/40; 134/42; 435/264; 210/610
[58] Field of Search ............. 210/610, 611, 922, 925; 134/25.1, 25.5, 38–40, 42; 435/264

[56] References Cited

U.S. PATENT DOCUMENTS

| | | | |
|---|---|---|---|
| 4,087,356 | 5/1978 | Marconi et al. | 210/922 |
| 4,146,470 | 3/1979 | Mohan et al. | 210/922 |
| 4,230,562 | 10/1980 | Olivieri et al. | 210/610 |
| 4,284,509 | 8/1981 | Lindorfer et al. | 210/922 |
| 4,382,873 | 5/1983 | Gatellier et al. | 210/610 |
| 4,414,333 | 11/1983 | Olivieri et al. | 210/610 |
| 4,462,910 | 7/1984 | Lepain et al. | 210/610 |
| 4,623,468 | 11/1986 | Lepain et al. | 210/922 |
| 4,811,791 | 3/1989 | Harnoy et al. | 166/305.1 |
| 4,822,490 | 4/1989 | Dyadechko et al. | 210/922 |
| 5,019,174 | 5/1991 | Wallach | 134/40 |

OTHER PUBLICATIONS

"Lecithins", by Bernard F. Szuhuaj et al., American Oil Chemists' Society, 1985.
"Korrosionsschutz Durch Beschichtungsstoffe", by Hanser Verlag, Oberflachenvorbereitung, 1980, pp. 246–248.
"Microbial Growth and Survival in Extremes of Environment", by G. W. Gould et al., Academic Press, 1980.
"Bacterial Adherence", by E. H. Beachey, Chapman and Hall, 1980.
"Bacterial Adhesion, Mechanisms and Physiological Significance", by Dwayne C. Savage et al., Plenum Press, 1985.
"Bacterial Adhesins", by K. Jann et al., Springer-Verlag, 1990.
"Liposomes: Preparation Characterization and Preservation", by D. Lichtenberg et al., Methods of Biochemical Analysis, vol. 33, pp. 337–462, Wiley, 1988.
"Petroleum Microbiology", by Ronald M. Atlas, MacMillan, 1984.
"Enhanced Biodegradation of Pesticides in the Enivironment", by Kenneth D. Racke, et al., American Chemical Society, 1990.
"Preparation of Liposomes", by Roger R. C. New, Liposomes: A Practical Approach, IRL Press, Oxford, 1990.
"Stability and Phase Behavior of Mixed Surfactant Vesicles", by S. A. Safran et al., The American Physical Society, 1991.

*Primary Examiner*—Thomas Wyse
*Attorney, Agent, or Firm*—Lowe, Price, LeBlanc & Becker

[57] ABSTRACT

The present invention provides a method for cleaning industrial and domestic surfaces and articles, as herein defined, which are contaminated with organic or lipophilic wastes, comprising applying liposomes thereto, which liposomes modify the physical properties of said wastes to increase the polarity and wettability thereof.

7 Claims, 3 Drawing Sheets

METHOD FOR CLEANING INDUSTRIAL AND DOMESTIC ARTICLES AND SURFACES CONTAMINATED WITH ORGANIC OR LIPOPHILIC WASTES

The present specification is a continuation-in-part of U.S. Ser. No. 07/653,319 filed Feb. 11, 1991 and entitled "Method and Composition for Enhancing the Biodegredation of Biodegradable Organic Wastes".

The present invention relates to a method for cleaning articles and surfaces contaminated with organic or lipophilic wastes. More particularly the present invention relates to a method for cleaning industrial and domestic surfaces and articles and for enhancing the biodegredation of biodegradable organic or lipophilic wastes by applying liposomes thereto.

Prior research and patents have been directed to enhanced oil recovery using modified liposomes.

Thus, e.g., there is described and claimed in U.S. Pat. No. 4,811,791 a method of recovering a petroleum from an underground source thereof comprising injecting into said underground source a petroleum displacement agent comprising a fluid and a modified liposome, said liposome being present in an amount sufficient to lower the interfacial tension between said fluid and said petroleum to below about 50 millidynes.

Said patent however was limited to the recovery of petroleum from an underground source.

As is known however there are many industrial sites such as petroleum tank farms, chemical plants and elsewhere where crude or refined hydrocarbons or hydrocarbon wastes, such as oil, gasoline, or the like, are spilled on the ground or into bodies of water such as ponds, lakes and oceans. Such wastes not only spread out and soak through the surface of the ground but seep into the ground and often float on the water table or disperse in the ground water.

Presently cleanup involves procedures such as excavation of the soil and incineration of the soil followed by disposal to a suitable disposal site. This is not only costly, but decontamination is often not complete and the disposal site then itself becomes a hazardous site.

An alternative to this costly disposal method is "washing" of the contaminated soil. This involves drilling one or more interceptor wells around the contaminated site to intercept the plume of hazardous material. It is preferred to flush or wash the contaminated soil with water, preferably water containing one or more surfactants, by spraying the site and allowing the water to percolate down through the soil and assist in "washing" the soil and driving the waste to the interceptor well or wells. This technique has been and is used around refineries to recover crude and refined hydrocarbons and on the larger sites the solvent system (water or water and surfactant) can be stripped of the hazardous waste and recycled for spraying to minimize costs. Presently the cost of "soil washing" is very high because of the cost of the surfactants and the fact that it may take years of spraying and recycling of solvent to wash the hazardous waste from the site and lower the amount of waste to an acceptable level.

The surfactants might present an ecological hazard and they are not entirely effective which increases the time required to wash the soil.

In contradistinction to the previously suggested methods and agents the present invention provides a method for readily cleaning up sites contaminated with hydrocarbons which can be carried out efficiently without effecting the ecology and at relatively low costs.

Thus, according to the present invention it has now been found, as described hereinafter, that liposomes modify the physical properties of oil and other organic and lipophilic wastes by increasing the polarity and wettability thereof.

Thus, in addition to petroleum, among the wastes which could be treated according to the present invention are:

1. Aromatic hydrocarbons (e.g. toluene, xylene and phenanthrene)
2. Nitro aromatics
3. Creosote
4. Chlorinated Aliphatics (e.g. tri-or or tetrachloroethylene)
5. Chlorinated Aromatics (e.g. hexachlorobenzene, pentachlorophenol)
6. Poly chlorinated biphenyl (PCB)
7. Pesticides (PHA's, TNT, RDS)
8. Xenobiotics
9. Greases
10. Synthetic or natural lipids (fats)

Phospholipids, which are the raw materials from which the liposomes used in the present invention are prepared are naturally occurring membrane-lipids in which glycerol is linked to two long chain fatty acids, a phosphoric acid residue and a nitrogen-containing base (e.g. choline). While most phospholipids of animal origin have one saturated and one unsaturated fatty acid, plants (e.g. soybean) supply phospholipids having mostly two polyunsaturated fatty acids. For large scale application of liposomal phospholipids for environmental aspects, availability and a low cost are two major prerequisites. Plant phospholipids fulfill both requirements: their potential yield is more than half-a-million tons per year and, as by-products of the edible oil industry; they are being used for animal feed. Liposomes for use in the methods of the present invention can be prepared from phospholipids which may be supplied in a dry state or, on a solution of phospholipid in an organic solvent which is either immiscible with water (e.g., ether, alkylhalides etc.) or miscible with water (e.g., alcohols, dimethylsulfoxide etc). For dispersion as liposomes, the first step may involve adding water which slowly hydrates the phosphatides and then transforms them to multilamellar liposomes (MLV). Alternatively, the above solutions in organic solvent can be mixed with water. In both cases, MLVs are eventually produced. In contradistinction however for rapid and efficient conversion into the desired and especially effective structural form of small, unilamellar liposomes (SUV) for use in the methods of the present invention, phospholipids in water should be subjected to ultrasonic irradiation or to a variety of procedures of extrusion through filters or small pores. For large scale preparation high-pressure homogenizers, micro fluidizers and similar technologies can be used. The liposomes can be stored at a concentrated suspension, or even as a lyophilized powder.

As stated it has now been found that these unilamellar liposomes modify the physical properties of organic and lipophilic wastes to increase the polarity and wettability thereof.

In a further aspect of the present invention it has now been found that liposomes can be used for cleaning industrial and domestic surfaces and articles contaminated with organic or lipophilic wastes.

Thus, according to the present invention there is now provided a method for cleaning industrial and domestic surfaces and articles, as hereinafter defined, which are contaminated with organic or lipophilic wastes, comprising applying liposomes thereto, which liposomes modify the physical properties of said wastes to increase the polarity and wettability thereof.

The term industrial and domestic surfaces and articles as used herein is intended to include machined parts and machinery surfaces whether made of plastic, metal, alloys thereof or combinations thereof and inter alia includes electronic components, electrical parts and even circuit boards as well as including domestic surfaces and articles such as glassware, china and ceramic plates, flatware, cooking utensils, as well as household surfaces as exemplified in the examples hereinafter.

It will be realised that in the context of the present invention the method herein described can be used for cleaning machines used for cutting, turning, grinding and milling in that by applying liposomes according to the present method easy and rapid cleaning of the machine surfaces from adhering greases, oils and fats which accumulate following operation of a such machine is achieved. It is also to be noted that the method of the present invention can be carried out in a wide range of operating temperatures, e.g., from temperatures close to 0° C. to those in the range of 100° C. since the liposomes are stable and effective across this entire temperature range.

As indicated in a preferred embodiment of the present invention there is provided a method for cleaning domestic articles and surfaces comprising applying liposomes thereto and this method is especially applicable to the cleaning of wastes selected from oils, greases, food residues and carbonacious combustion products.

In another preferred embodiment of the present invention there is provided a method for cleaning industrial articles and surfaces contaminated with biodegradable organic or lipophilic wastes, comprising applying liposomes thereto, which liposomes modify the physical properties of said wastes to increase the polarity and wettability of said waste and its availability for enhanced microbial interaction, while concomitantly supplying essential nutrients for enhanced growth of microorganisms adhering thereto.

As is known, oil is a poor substrate for most microorganisms. Being a hydrocarbon it contains only carbon and hydrogen; an external source of nitrogen, phosphorus and other essential nutrients are needed to support bacterial growth (Gould, G. W. and Corey, J. L., Eds. Microbial Growth and Survival in Extremes of Environment; Academic Press, 1980).

Being very hydrophobic, oil does not interact with water and forms a separate phase. The forces which prevent its interaction with water also reduce, very considerably, interaction of the oil with other surfaces including those of many microorganisms. (Beachey, E. H., Ed.: Bacterial Anderence, Chapman and Hall, 1980; Berkely et al. Eds: Elis Horwood, Chichester, England, 1976; Savage, D.C. and Fletcher, M., Eds: Bacterial Adhesion. Mechanism and Physiological Signifcance, Plenum, 1985; Jann, K. and Jann, B. Bacterial Adhesions. Springer-Verlag, 1990; Atlas, R. M., Ed: Petroleum Microbiology, MacMillan, 1984).

Since the liposomal structures used in the methods of the present invention are in fact composed of phospholipids (Szuhaj, B. F., Ed: Lecithin: Sources, Manufacture, Uses. Am. Oil Chem. Soc. 1989), and (Lichtenberg, D. and Barenholz, Y. Methods of Biochemical Analysis (D. Glick, ed.) Vol. 33, pp. 337–462, Wiley, 1988) they can serve as a source of carbon, hydrogen, phosphorus and nitrogen and, because of their vesicular structure, they can be used as a reservoir of encapsulated nutrients, minerals and growth factors.

Furthermore and as described and exemplified herein not only do the liposomes used in the present invention modify the physical properties of said wastes to increase the polarity and wettability thereof but they also increase its availability for enhanced microbial interaction while concomitantly supplying essential nutrients for enhanced growth of microorganisms adhering thereto.

The method of the present invention can utilize any of the presently known or further discovered microorganisms (e.g. such as mixtures of microorganisms present in and isolated from natural flora or genetically engineered organisms) which are capable of degrading hydrocarbons including:

*Arthrobacter paraffinens*
Arthrobacter sp.
Mycobacterium
*Rhodococcus rhodochrous*
Rhodococcus sp.
Achromobacter sp.
*Acinetobacter calcoaceticus*
Acinetobacter sp.
*Nocardia globerula*
*Nocardia paraffinae*
Nocardia sp.
Pseudomonas sp.
Bacillus sp.
Clostridium sp.
Corynebacterium sp.
Flavobacterium sp.
Candida sp.
Aspergillus sp.
Rhodotorula sp.
Fusarium sp. and
Penicillium sp.

Preliminary experiments indicate that liposomes induced a very considerable (up to 5–6 logs) enhancement of growth of bacteria present in a natural "environmental-hazard", i. e. soil contaminated with petroleum. When these bacteria were collected and further incubated with crude petroleum, addition of liposomes increased the bacterial count by another 5 logs. The bacteria whose growth was induced by the liposomes oxidized $^{14}$C-hexadecane and induced visible changes in the appearance of the oil, including its emulsification.

Numerous tests were carried out, on a laboratory scale, simulating treatment of soils contaminated with oil. For this purpose various oils (e.g. light oils, Alaskan crude oil or machine oil) were spread on silica, sand or earth. Also, earth contaminated with heavy heating oil was used. Liposomes were added without or with shaking and the released oil measure. In all cases part of the oil floated on top of the water layer, another part remained dispersed in the aqueous (liposome-containing) medium and could be collected by centrifugation. A considerable portion of the total oil could thereby be recovered. As in previous cases, the bulk of the liposomes remained intact, could be separated from the extruded oil and reutilized for further cleanup.

Thus, the present invention also provides a method for cleaning a site contaminated with biodegradable organic and lipophilic wastes, comprising applying liposomes to said waste site, which liposomes modify the physical properties of said wastes found at said site to increase the polarity and wettability of said waste and its availability for enhanced microbial interaction, while concomitantly supplying essential nutrients for enhanced growth of microorganisms adhering thereto.

As indicated however, the methods of the present invention are equally applicable for the treatment of greases and lipids deposited on metal or plastic surfaces, as well as for treatment of oil spilled on soil as will also be seen from the examples hereinafter.

In U.S. Pat. Nos. 4,230,562 and 4,414,333 there are described methods and compositions for depolluting fresh water and salt water bodies from crude oil, petroleum products and their derivatives which includes inter alia providing lecithin as a phosphorus source. However, as indicated hereinbefore for rapid and efficient conversion of a phospholipid source such as lecithin into the structural form of small unilamellar liposomes having the desired properties of modifying polarity and wettability of organic wastes, for use in the methods of the present invention, it is necessary to subject the same to ultrasonic irridation, extrusion or similar processes. Therefore neither of these patents teaches or suggests the methods of the present invention.

As background it is worthwhile to note that currently there are two basic approaches to physical cleanup of oil spilled on a water surface: dispersal by detergents or containment and recovery. For the latter, progress of the oil is prevented by a barrier of floating booms and collection is achieved by skimmers, sorbents or manual methods.

In contradistinction to this state of the art numerous laboratory experiments have been carried out to define the effects which application of liposomes have on oil spread on water and the applicability of these findings to the method proposed in the present invention. For this purpose we have compared liposomes prepared from a wide variety of phospholipids, from the crudest to the purest; from polyunsaturated to hydrogenated; unilamellar and multilamellar. Numerous oils were used ranging from hexane, through Alaskan crude to solid tetracosane ($C_{24}H_{50}$) and liposomes were prepared in distilled, tap, seawater or saline and various solutions of divalent ions. We have also compared the effects of the liposomes with those produced by numerous detergents (nonionic, anionic sulfonates, commercial dispersants, e.g., Corexit 9527, as well as sodium oleate).

The results can be summarized as follows:
1. Addition of traces of the liposomal dispersion to water having oil spilled on it immediately pushes away thin layers of oil forming viscous, condensed oil droplets.
2. Addition of oil onto water which already contains liposomes, results in its coalescence into viscous, condensed droplets.
3. The lecithin-treated droplets adhere to and can be collected by many objects.
4. Gentle shaking of thick layers of oil on liposome-containing water results in formation of small droplets which rise to the surface but do not coalesce into a uniform oil layer.
5. Vigorous shaking of the above results in smaller droplets which rise slowly to the surface and do not coalesce.
6. Extensive ultrasonic irradiation of the above results in formation of much smaller droplets which stay dispersed, in the aqaueous phase, for extended periods.
7. Treating oil on water with liposomes as described above, followed by gentle shaking or stirring, results in tight adherence of the condensed, viscous droplets to the surface of the container (i.e. glass, plastic or ceramic). Up to nearly 100% of the oil can thus be adsorbed onto the surface of the container can then be collected. The oil which adheres to the surface of the container can be dislodged by a light hydrocarbon, such as hexane.

Based theron there is claimed in co-pending U.S. Ser. No. 07/943,147 a method for treating oil spills on water comprising applying liposomes to a body of water to form a monomolecular layer of phospholipid molecules on the water surface which phospholipid molcecules break up a continuous layer of oil into oil droplets each of which is surrounded by a monomolecular layer of phospholipids. The teachings of said specification are incorporated herein by reference.

Similarly it has now been found and proved that industrial waste areas such as contaminated soil and industrial products can be cleaned by applying liposomes thereto according to the method of the present invention.

Furthermore household surfaces such as floors and tiles and even soot covered kerosene heaters as well as household articles such as dishes, glasses and utensils can be cleaned of grease, grime, food residues and other organic or lipophilic wastes by the method of the present invention by applying liposomes thereto which liposomes modify the physical properties of said wastes to increase the polarity and wettability thereof.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 2A:
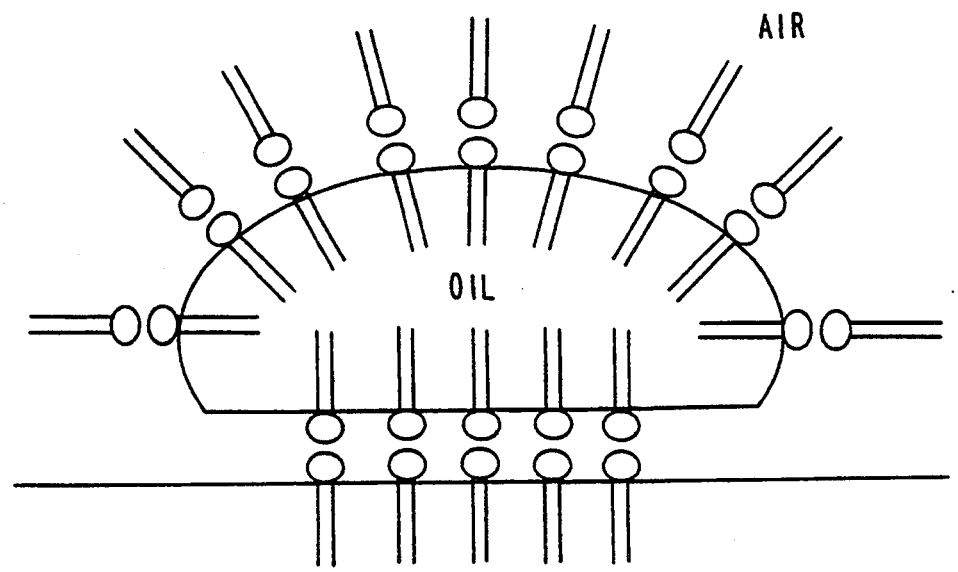
Figure 2B:
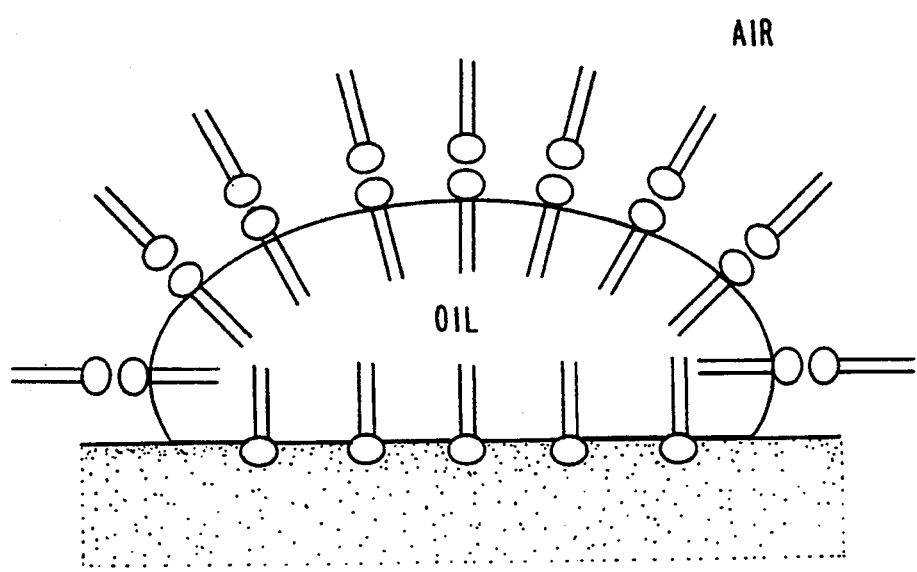
Figure 3:
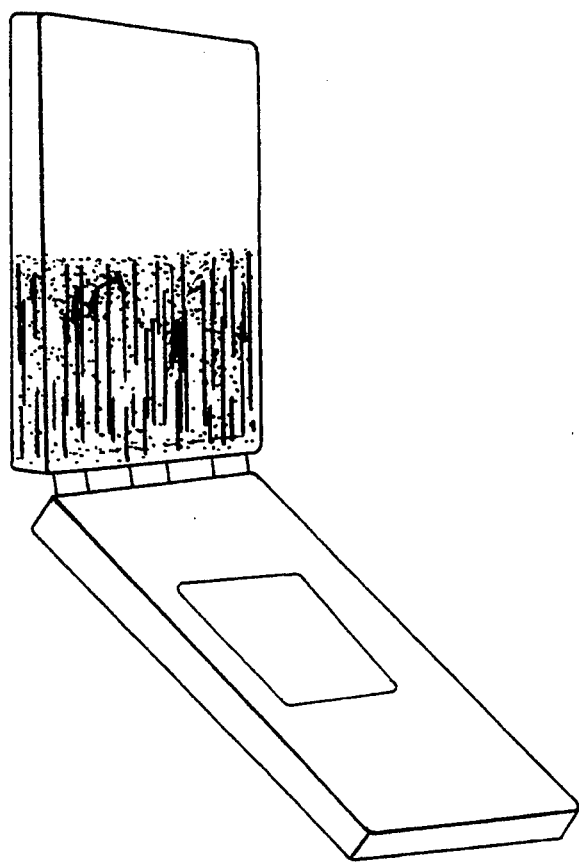

In the drawings:

FIG. 1 is a schematic representation of the physical state of an oil droplet on water, surrounded by phospholipids originating from liposomes, the non-polar tails of said phospholipids being directed towards the oil droplet and the polar heads of said phospholipids extending outwardly for interaction with the environment;

FIG. 2A-B are a schematic representation of the physical state of an oil droplet surrounded by phospholipids originating from liposomes which facilitate its adherence to hydrophobic or hydrophilic surfaces; and FIG. 3 is a photograph of a plastic board half of which has been immersed in liposomes and thereby cleaned as described in Example 19 hereinafter.

Addition of liposomes to an oil spill on water as described and claimed in co-pending Ser. No. 07/653,317 causes an immediate spreading of phospholipid molecules on the water surface, forming a monomolecular or biomolecular layer at the oil-water interface, thereby wetting the oil. The phospholipid molecules mediate between the oil and water by directing their hydrophobic fatty acid residues towards and/or within the oil phase while their polar headgroups are in contact with the water. The next step results in breaking up the continuous oil phase into droplets each of which is surrounded by a monomolecular layer of phospholipids. A likely arrangement of the phospholipid molecules at the respective oil-water and oil-air interfaces is shown in FIG. 1. These oil droplets are thus surrounded by a layer of phospholipid molecules which prevents the formation of a continuous oil layer on the water surface. When using liposomes for interacting with oil on water, those phospholipid molecules which coat the oil droplets constitute a minor portion of the total liposomal content. Thus, the vast majority of the liposomes remain intact and serve as a reservoir for coating more oil once it reaches them.

Pouring oil on water which had been pretreated with liposomes resulted in its instant conversion to droplets (as per FIG. 1), thereby preventing its spreading, as a continuous phase, on the water surface. The oil stayed as condensed, non-spreadable drops of oil on the surface of phospholipid-water interface of the liposome-containing water.

Oil spread on water adheres poorly to solid surfaces. This is not so when the oil is converted to droplets surrounded by phospholipid molecules. Then it adheres to numerous surfaces and its removal from the water by skimming is facilitated. The precise molecular organization of the phospholipid layer, surrounding the oil-drop at the solid surface, probably depends on whether the latter is hydrophobic (FIG. 2A) or hydrophilic (FIG. 2B). The above observations therefore show that the use of liposome will broaden the spectrum of microorganism which can adhere to the oil and thereby facilitate its biodegradation.

EXAMPLE 1

Soil, contaminated with petroleum, collected at a local gas station was incubated in minimal medium, and bacteria which grew were collected. Inoculums of $3 \times 10^3$ of these bacteria were incubated in 1 ml minimal medium, in the absence and presence of increasing concentrations of unilamellar liposomes composed of S45-M (a soybean lecithin which we have modified by converting the primary amino phospholipids to their corresponding tertiary amino equivalents, to contain mostly the neutral phosphatidylcholine), After 5 days incubation at 30° C. the following values were obtained:

| Liposomes (% phospholipids) | Bacterial count per ml |
| --- | --- |
| 0.0 | $3 \times 10^3$ |
| 0.05 | $5 \times 10^7$ |
| 0.10 | $1 \times 10^9$ |
| 0.2 | $5 \times 10^6$ |
| 0.4 | $<10^3$ |
| 0.8 | $<10^3$ |

The above data indicate a 5–6 log stimulation of the bacterial growth by the liposomes at the optimal concentration of liposomal phospholipids.

EXAMPLE 2

An inoculum of $5 \times 10^3$ of the above bacteria was incubated with 0.5 ml minimal medium to which 0.15 ml of Alaskan crude oil was added. When S45-M liposomes (0.15%) were included in the medium, the number of bacteria after 3 days incubation at 20°–30° C. increased to more than $10^6$ per ml, whereas in the absence of liposomes no growth occurred and it remained identical to the inoculum. Thus, under these conditions (i.e. medium containing petroleum) the liposomes increased the bacterial growth by 2–3 logs.

EXAMPLE 3

The above experiment was repeated, except that various other liposomes exemplified replaced the S45-M. The following list serves to exemplify this:

a. Soybean phosphatides ranging from 10–100% PC and containing
various proportions of PE, PI and other lipids.

b. Egg phosphatides ranging from 80–100% PC and 0–20% PE as well as small quantities of sphingomyelins.

c. Synthetic PCs containing such fatty acid as myristic, palmitic or stearic.

d. Egg or soybean PC which had been hydrogenated and is completely saturated.

After 3 days incubation at 20°–30° C. the bacterial count per ml ranged from $10^5$ to $10^6$ indicating a 2–3 log stimulation of the bacterial growth by the respective liposomes.

EXAMPLE 4

Soils contaminated with petroleum were obtained from the oil-loading terminal at Israel's southern port of Eilat. Two samples were collected: 1. A dry soil (code ECS-A); 2. A "wet", oily soil (code ECS-B). 2 g of each of the respective soils were incubated in 2 ml or distilled water in the absence or presence of S45-M liposomes (0.125–0.5%). Each flask also received 200 μl of $1^{14}$C-hexadecane. After 5 days incubation at 30° C. the bacterial count per ml as well as the quantity of $^{14}CO_2$ released from the radioactive hexadecane were determined.

| Soil | Soil without liposomes | Soil with liposomes | |
| --- | --- | --- | --- |
| | | Bacteria/ml | $^{14}$C-hexadecane oxidized |
| ECS-A | $3 \times 10^5$ | Average $4 \times 10^6$ | 0.1 μl |
| ECS-B | $3 \times 10^6$ | Average $4 \times 10^8$ | 0.08 μl |

These data indicate an enhancement by the liposomes of bacterial growth as well as an oxidation of the radiolabelled hexadecane to $^{14}CO_2$.

EXAMPLE 5

The above experiment was repeated, now using 40 μl of 1-$^{14}$C hexadecane and 0.25% S45-M liposomes. after 4 days incubation at 30° C. the results were as follows:

| | Without liposomes | | With liposomes | |
| --- | --- | --- | --- | --- |
| Soil | bacteria/ml | $^{14}$C hexadecane oxidized | bacteria/ml | $^{14}$C hexadecane oxidized |
| ECS-A | $4 \times 10^6$ | 0.25 l | $9 \times 10^8$ | 0.30 l |
| ECS-B | $2 \times 10^4$ | 0.26 l | $4 \times 10^9$ | 0.49 l |

These data again indicate enhancement of bacterial growth and oxidation of the $^{14}$C-hexadecane by the presence of the liposome in the medium.

EXAMPLE 6

1 g each of the oil contaminated soils ECS-A and ECS-B were added to 20 ml of tap-water and incubated at 30° C. by shaking for 4 and 18 days in the absence and presence of increasing concentrations of S45-M liposomes.

| S45-M liposomes (%) | ECS-A bacteria/ml | | ECS-B bacteria/ml | |
|---|---|---|---|---|
| | 4 days | 18 days | 4 days | 18 days |
| 0 | $8 \times 10^5$ | $2 \times 10^6$ | $3 \times 10^5$ | $1 \times 10^6$ |
| 0.125 | $2 \times 10^7$ | $1 \times 10^9$ | $> 10^{10}$ | $> 10^{10}$ |
| 0.25 | $3 \times 10^7$ | $9 \times 10^8$ | $6 \times 10^9$ | $> 10^{10}$ |
| 0.50 | — | $1 \times 10^2$ | $1 \times 10^7$ | $2 \times 10^8$ |

The data indicated about 2–3 log stimulation of liposomes of bacterial growth using the ECS-A and close to 5 log with the ECS-B soil. Optimal growth was obtained with 0.1–0.2% liposomal phospholipid. When incubation was continued for one more week, a heavy white-emulsion appeared in the flasks containing ECS-B and 0.25% as well as 0.50% liposomes.

EXAMPLE 7

Bacteria ($2 \times 10^3$) isolated from ECS-A and ECS-B soils were used to innoculate 5 ml distilled water containing 0.5 ml Alaskan crude oil in the absence or presence of liposomes. After 4 days incubation at 30° C., the bacteria did not proliferate in flasks without liposomes whereas in the presence of S45-M liposomes, the bacterial count increased by 5 to 8 logs reaching to $3 \times 10^8$ ml. This indicates that the bacterial flora which grew on the oil-contained soil further proliferated by more than 5 logs in the presence of Alaskan crude oil and liposomes.

EXAMPLE 8

1 g each of the "wet" oil-contaminated soil (ECS-B) was incubated in 3 ml distilled water with several liposomal preparations at 0.1–0.2% phospholipid. After 8 and 13 day incubation at 30° C. the following values were observed.

| Liposome | Bacterial count per ml | |
|---|---|---|
| | 8th day | 13th day |
| S45-M (containing mostly PC) | $3 \times 10^5$ | $5 \times 10^4$ |
| S100 (purified soybean PC) | $8 \times 10^8$ | $7 \times 10^9$ |
| Egg PC | $1.2 \times 10^9$ | $> 10^{10}$ |
| S45 (partially purified soybean) | $1.8 \times 10^9$ | $> 10^{10}$ |
| Lecithin containing PC and PE | $6 \times 10^7$ | $6 \times 10^9$ |
| Hydrogenated, fully saturated PC | $1.6 \times 10^7$ | $8 \times 10^9$ |

The above data indicate that bacteria growth was stimulated by liposomes 3–500,000 fold, also that unsaturated PC is more efficient for enhancing bacterial growth than the saturated PC equivalent and the partially purified soybean lecithin (S45) still containing negatively charged lipids is somewhat less efficient than the product (S45-M) which we have obtained by converting the PE to PC.

EXAMPLE 9

50 g each of soils ECS-A or ECS-B were sprayed with 0.2 g soybean phosphatidylcholine (PC) in 10 ml hexane (final concentration 0.4% PC). The sprayed soils were dried in an oven at 105° and water was added as specified in the table. The flasks were incubated at 30° C. for 2 weeks, 1 g samples were collected, suspended in minimal medium and the bacterial count per ml determined,

| Soil | Liposomes | Water | Bacterial count per ml |
|---|---|---|---|
| ECS-A 5 g | — | 0.5 ml | $5 \times 10^5$ |
| ECS-A 5 g | + | — | $3 \times 10^3$ |
| ECS-A 5 g | + | 0.5 ml | $1 \times 10^7$ |
| ECS-A 5 g | + | 1.5 ml | $2 \times 10^7$ |
| ECS-B 10 g | — | 1.0 ml | $1 \times 10^5$ |
| ECS-B 10 g | + | — | $1.1 \times 10^3$ |
| ECS-B 10 g | + | 1.0 ml | $8 \times 10^8$ |
| ECS-B 10 g | + | 3.0 ml | $2 \times 10^9$ |

These data indicated that bacterial growth is dramatically enhanced when soils, contaminated with petroleum have been coated with phospholipids by spraying a solution of these lipids in the solvent (e.g., light petroleum, alcohols, chlorinated hydrocarbons or other suitable solvents) followed by hydration of the soil with water. In the absence of phospholipids, hydration increased bacterial growth by 2 logs. Coating the soil with phospholipids follow by hydration resulted in an increase of 4 to 6 logs of the bacterial population.

Phospholipids are natural compounds present in all membranes including those of human, animal, plants or microorganisms. Also, they are employed in routine clinical use as emulsifiers for intravenous infusion of emulsified lipids and for drug-delivery in humans. Recently, they have been used in fisheries for feeding fish. Thus, it is believed that they will have no toxic effects on marine flora and fauna and could therefore be applied to oil-wells, soils contaminated by oil or wastes, water or beaches without need for prolonged toxicological studies. Furthermore, because of their potential use as nutrients, the excess phospholipids will be biodegraded by microorganisms, thus eliminating any possibility of unforeseen hazards to the flora or fauna of the sea, its shore or underground water.

Small, unilamellar liposomes can be prepared in small scale by sonic irradiation or extrusion. For larger scale preparations high pressure could be employed, permitting preparation of many thousands of gallons of liposomes in a day. Nutrients, minerals and other growth factors can be added during the preparation of the liposomes, resulting in their encapsulation in the interior or alternatively, incorporation into the membrane of the liposomes.

Also one could prepare a concentrated dispersion of liposomes (e.g. containing about 20 percent of phospholipids in water) to facilitate delivery and on-the-spot dilution with water. Alternatively, in the presence of cryoprotectant agents, the liposomes could be lyophilized or spray-dried and delivered/stored as a dry powder.

Based on the above-mentioned stability studies, concentrated stocks of liposomes can be stored for prolonged periods and used when needed.

Being aqueous dispersions, the liposomes can be applied to the ground or water-surface by any means used for delivering water (e,g. spraying, flooding, etc). Alternatively, they could be dissolved in a light kerosene (e.g. hexane) and sprayed on the oily surface, thereby combining two processes, i.e., delivery of phospholipid and softening of the weathered oil or waste. Subsequent application of water, following evaporation of the kerosene, will cause in situ swelling of the phospholipid and formation of large multilamellar liposomes at the site of the contaminated area.

EXAMPLE 10

1 gram of sandy soil contaminated with polycarbonated biphenyl (PCB) was dispersed in water, and liposomes prepared from soybean lecithin were added at varying concentrations. The mixtures, in 5 ml volume, were subjected to ultrasonic irradiation in a horn-cup (Branson sonifier 250W) for 13 minutes at 75–80% output and an initial temperature of 45°–50° C. The samples were then separated by centrifugation to an aqueous supernatant and sedimented soil. Gas-liquid chromatographic (GLC) analysis indicated that when the final concentration of the liposomal lecithin was 0.15%, 37% of the PCB was removed from sand and when it was raised to 0.5%, 67% of the PCB was removed from the sand and located in the aqueous medium.

EXAMPLE 11

An experiment as in Example 10 was repeated, except that the PCB was present in a sludge, containing 60% moisture and 5% hydraulic fluid. 1 ml of the sludge was mixed with water and liposomes to a final volume of 5 ml and subjected to ultrasonic irradiation as per Example 10. Following centrifugation the aqueous phase contained 33% of the total PCB.

EXAMPLE 12

5 g soil contaminated with PCB was introduced into a glass column and a dispersion containing 0.5% liposomes (by lecithin weight) was filtered through. Analysis indicated that 40% of the PCB were eluted from the soil.

EXAMPLE 13

A metal bar coated with silicone grease was subjected to ultrasonic irradiation, in a sonic bath (Transsonic 460/H, Elma, Bergweis, Austria) containing 0.1% soybean lecithin liposomes for 10 minutes at 70° C. This resulted in complete removal of the silicone grease from the metal.

EXAMPLE 14

Metal bars coated with heavy organic grease were sonicated with 0.1% liposomes for 15 minutes, at 70° C. They were then rinsed with water, dried with a fan and coated, by spraying, with a transparent film of lacquer ("superspeed", Saria Inc., San Carlos, Calf). The nature of the lacquer-coating and its tight adherence to the metal indicated a total degreasing of the metal.

The above procedure was compared using liposomes of soybean and egg lecithin and using liposomes ranging from 100% soybean phosphatidylcholine (PC, lecithin) down to 10% PC. In all cases a complete degreasing of the metal and stable lacquer-coating was obtained.

EXAMPLE 15

A brass tube, covered with a tightly-adhering, burned out graphite-containing organic ointment, was subjected to ultrasonication in a bath-sonicator as per Example 13. In this case, because of the extremely strong adherence of the burned-out ointment, 0.1–0.5% liposomes did not completely remove it. When the concentration of the latter was raised to 3%, there was a complete removal of the covering layer, resulting in a corresponding shining area on the brass.

EXAMPLE 16

Dirty dishes (e.g., earthenware, ceramic, plastic and China plates, glasses and stainless steel utensils) covered with dried-out food residues, were introduced into an AEG (Favorit-L) dishwasher and subjected to a standard cycle (double rinse with cold water; wash with heating to 60° C.; rinse with cold water; rinse at 60° C.; drying), but instead of dishwasher soap, about 10–20 ml of 10% liposomes prepared from soybean lecithin were introduced into the soap-storage compartment of the machine. Following the entire cycle the dishes were treated and the following was observed: All glass dishes, in the upper portion of the dishwasher were perfectly clean. Also, most of the plates and utensils were so. The exception were some spots of tightly-adhering dirt particles on those plates and utensils which were very tightly packed in the dishwasher, so that the spray probably could not reach them directly.

The same procedure was repeated using a Telsa International mini (Sweden) dishwasher at 65° C., followed by three washes with cold water and one at 55° C. Using 15 ml of 17% liposomes all glass, ceramic, China and stainless steel dishes and utensils were completely cleaned.

EXAMPLE 17

0.5% liposomes prepared from soybean-lecithin in tap water were applied to a cloth and the latter was used to wet a thick layer (about 2 mm) of soot covering the interior (burner and burning chamber) of a Delville kerosene heater. Five minutes after this application the soot was wiped with a cloth slightly wetted with water, resulting in complete removal of the soot, leaving the metal entirely clean. In a parallel experiment in which the soot was treated with a cloth wetted with water (instead of the liposomes) wiping with a wet cloth removed only a small portion of the soot, most of which remain adhered to the metal of the burner and chamber.

EXAMPLE 18

Soot from the above burner which fell on the floor (made of ceramic tiles) was wetted with 0.5% liposomes and then wiped with a dry paper tissue, resulting in complete removal of the soot and cleanup of the floor. In parallel, wetting the soot with water only and wiping with a paper tissue removed only a small portion of the soot from the floor.

EXAMPLE 19

Cleaning plastic - A plastic board contaminated with grease: The grease could not be removed by wiping. Half of the contaminated plastic board was placed in Transsonic 460/H, 35 KHz from Elma Bergweis, Austria. The ultrasonic bath contained 1200 ml of 0.1% (by weight of lecithin) liposomes in water. After 10 minutes of ultrasonic irradiation at 65° C. the plastic board was removed and washed. The enclosed figure demonstrates the complete cleaning of that part of the plastic board which was embedded in the liposomes.

EXAMPLE 20

Samples of various metal pieces (e.g., brass, nickel, aluminum, iron) covered with grease were placed in an ultrasonic bath (Transsonic 460/H, 35 KHz) containing 1.2 liters of small unilamellar liposomes, 0.1% lecithin (by weight) in water. After 10 minutes of ultrasonic irradiation at 60°–70° C. the metal pieces were removed from the bath and washed in water. All metal pieces were clean from the grease. The grease floated over the liposomes dispersion and metal dust precipitated in the bottom. The grease which is collected from the surface could now be potentially subjected to bioremediation.

EXAMPLE 21

Samples of various metals contaminated with grease were tested for contact angle. For this a drop of water was placed over the contaminated metal pieces. The contact angle was measured using a Zeiss microscope and found to be about 180°. These metal pieces were placed in a beaker containing 200 ml of 0.1% small unilamellar liposomes (SUV) prepared from soybean lecithin (by weight of lecithin in tap water). The beaker was placed in an ultrasonic bath (SONOREX Super RK 103H, 35 KHz, 160–320 W). The bath contained tap water. After 10 minutes of ultrasonic irradiation starting from 45° C., ending at 55.5° C., the metal pieces were removed and washed in hot water. The metal pieces were tested by measuring the contact angle as described above. The test results showed that after cleaning, the contact angle was reduced to values below 90°. This indicates defatting of the metal. Comparison with treatment with conventional organic solvents show contact angles higher or similar to those obtained with the liposomes. These measurements followed the procedure of K. A. van Oeteren; Korrosionsschutz durch Beschichtungsstoffe. Hanser Verlag, Munchen, Wien, 1980, pp. 246–248.

EXAMPLE 22

The same as in the previous example but the metal pieces were placed in water (and not in lecithin liposomes). There was no removal of the grease.

EXAMPLE 23

The same 200 ml of liposomes that were used in Example 21 were again used for treating other grease-coated metal pieces. Two minutes ultrasonic irradiation at 69° C. was sufficient to obtain complete degreasing of the metal pieces, indicating that the liposomes, recovered after degreasing, could be re-used for cleanup of other grease-covered metals.

EXAMPLE 24

In a test if machine oil interferes with degreasing, 16 ml of machine oil were added to the same liposomes (200 ml) used in the previous example and metal pieces contaminated with grease were added. Five minutes of ultrasonic irradiation at 76° C. caused oil emulsification and partial degreasing. The metal pieces were then transferred to 200 ml of 0.1% fresh liposomes; complete degreasing was obtained after 10 minutes ultrasonic irradiation at 60° C.

EXAMPLE 25

The experiment described in Example 21 was repeated, the metal pieces were cleaned and the grease-dispersion in the liposomes were transferred to four glass tubes, which were centrifuged at 10,000 rpm for 10 minutes; all the oil floated above the liposome dispersion. Metal dust precipitated on the bottom of the test-tubes and the liposomes could be reused for degreasing. The grease from the top had special properties of adsorption to paper, ceramics, etc. and it is expected also to bacteria, thereby facilitating its biodegradation.

EXAMPLE 26

Metal pieces coated with solid, kidney fat were placed in an ultrasonication bath with liposomes as described in Example 21. After 7 minutes of irridation at 64° C. contact angle test gave an angle smaller than 90°. The metal pieces were then transferred to 1% dispersion of soybean-lecithin small unilamellar liposomes (SUV); better defatting (but still not complete) was obtained after 10 minutes ultrasonic irradiation at 72° C. When liposomes prepared from 1% egg yolk lecithin were used complete defatting was obtained.

EXAMPLE 27

The procedure of example 26 was repeated however the metal pieces coated with kidney fat were defatted by one step ultrasonic irradiation in 1% small unilamellar liposomes of egg lecithin. Complete defatting (based on contact angle measurement) was obtained.

EXAMPLE 28

Degreasing by 0.08% liposomes (by weight of lecithin) in pure water using an industrial degreasing machine produced by Zippel, Neutraubling, Germany was carried out. The machine, like a dishwasher, has two sprinklers—one on the bottom and one at the top—which rotate and sprinkle at a pressure of 4 bars at 70° C. The machine has two reservoirs, each having a volume of 300 liters. Into the left one the liposomes (0.1%) at pH 6.8 were introduced, while the right reservoir was filled with tap water. The machine has monitors for temperature, pH and conductivity. The extent of degreasing was measure using AHLBRANDT system kit based on an interfacial pressure test.

EXAMPLE 29

Cleaning of a plastic tray: The tray was heavily contaminated with oil, grease and metal dust. The tray was placed in the above mentioned Zippel machine with its face down. The cleaning cycle included 3 minutes sprinkling with liposomes and 1 minute with the water, then drying. This process was sufficient for complete cleaning of the tray. Only one spot which remained outside the sprinklers coverage remained dirty.

EXAMPLE 30

During the degreasing process described above most of the oil or grease floated over the liposome reservoir and only a small amount over the tap water reservoir. The oil from both reservoirs was easily removed by paper or a metal-net, leaving clean reservoirs behind. The liposome-reservoir could be filtered, without loss of the liposomes through filters of 0.2 μm pore size to remove small particles.

EXAMPLE 31

The Zippel degreasing machine was filled with various metal pieces of different sizes and shapes, including a large engine-block, knife blades, metal sheets, copper blocks, aluminum locks, iron and stainless steel pipes, screws, electronic contacts, and many other machined parts which were coated with various oils, greases and fats. The degreasing cycle described in Example 26 led to complete degreasing of the respective items, making them suitable for further processing such a phosphorization, painting, lacquer-coating, etc.

EXAMPLE 32

A variety of tubes and pipes were placed in a cleaning machine (Niagara Machinery AB, Gotebory, Sweden) which utilizes a fast stream of hot water sprayed at a pressure of 6 bars. One thousand liters of 0.09% soybean liposomes were introduced in this cleaning machine and the pipes and tubes were sprayed for 12 seconds at 70° or 80° C. resulting in their degreasing.

EXAMPLE 33

The same machine as in example 32 was used for cleaning aluminum tubes coated with an oil enriched with rapeseed glycerides which also included 15% fatty acids (e.g., oleic acids). After 4 cycles of 10 seconds each, the tubes were completely deoiled.

EXAMPLE 34

The conditions of example 31 were repeated except that 5 liters of Henkel Sellcleaner 87M (i.e., at a final concentration of 0.5% which is 4–8 times less than when used alone for metal cleaning) were added to the liposomes. Spraying this mixture (i.e., 0.09% liposomes and 0.5% Henkel Sellcleaner 87M) for 10 seconds at 80° C. resulted in degreasing characterized by a complete wetting of the metal tubes and bars.

EXAMPLE 35

Liposomes were tested for their potential use in cleanup of electronic components, electrical parts and printed circuit boards. Several uncleaned electronic boards were immersed in soybean or egg liposomes (0.1–0.5%) and subjected to ultrasonications for 10–15 minutes, at 60° C. in the Transsonic 460/H bath sonicator. This resulted in cleanup of the boards by removal of the brownish material covering the electronic circuit connections.

Procedures described in the above examples when carried out without the presence of liposomes resulted in no or only partial removal of the various contaminating wastes from the various surfaces and articles exemplified above.

Referring to each of the above examples it will be realised that the waste product removed from the articles and surfaces is coated with unilamellar liposomes which liposomes increase the availability of said waste products for enhanced microbial interaction while concomitantly supplying essential nutrients for enhanced growth of microorganisms adhering thereto thereby assuring the subsequent biodegradation of these liposome covered wastes after their disposal.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for cleaning solid industrial and domestic surfaces and articles which are contaminated with organic or lipophilic wastes, comprising applying liposomes thereto, which liposomes modify the physical properties of said wastes to increase the polarity and wettability thereof.

2. A method according to claim 1 for cleaning solid domestic articles and surfaces contaminated with organic or lipophilic wastes comprising applying liposomes thereto, which liposomes modify the physical properties of said wastes to increase the polarity and wettability thereof.

3. A method according to claim 2 wherein said wastes are selected from oils, greases, food residues and carbonaceous combustion products.

4. A method according to claim 1 for cleaning solid domestic surfaces comprising applying liposomes to a domestic surface to modify the physical properties of organic or lipophilic wastes adhering thereto.

5. A method according to claim 1 for cleaning solid domestic articles comprising applying liposomes to a domestic article to modify the physical properties of organic or lipophilic wastes adhering thereto.

6. A method according to claim 1 for cleaning solid industrial articles and surfaces contaminated with organic or lipophilic wastes, comprising applying liposomes thereto, which liposomes modify the physical properties of said wastes to increase the polarity and wettability thereof.

7. A method according to claim 1 for cleaning solid industrial articles and surfaces contaminated with biodegradable organic or lipophilic wastes comprising applying liposomes thereto which liposomes modify the physical properties of said wastes to increase the polarity and wettability of said waste and its availability for enhanced microbial interaction, while concomitantly supplying essential nutrients for enhanced growth of microorganisms adhering thereto.

* * * * *